(12) United States Patent
Ausserlechner

(10) Patent No.: US 9,651,581 B2
(45) Date of Patent: May 16, 2017

(54) HIGH CURRENT SENSORS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 958 days.

(21) Appl. No.: 13/247,268

(22) Filed: Sep. 28, 2011

(65) Prior Publication Data

US 2013/0076341 A1   Mar. 28, 2013

(51) Int. Cl.
  G01R 19/00 (2006.01)
  G01R 33/07 (2006.01)
  G01R 33/09 (2006.01)
  G01R 15/20 (2006.01)

(52) U.S. Cl.
  CPC .................. G01R 15/207 (2013.01)

(58) Field of Classification Search
  CPC .............................. G01R 15/00; G01R 15/20
  USPC ......................................................... 324/117
  See application file for complete search history.

(56) References Cited

U.S. PATENT DOCUMENTS

| | | | | |
|---|---|---|---|---|
| 4,580,095 A * | 4/1986 | De Vries | ...................... | 324/126 |
| 5,041,780 A * | 8/1991 | Rippel | ...................... | 324/117 H |
| 5,587,651 A * | 12/1996 | Berkcan et al. | ............. | 324/127 |
| 5,587,652 A * | 12/1996 | Berkcan et al. | ............. | 324/127 |
| 5,642,041 A * | 6/1997 | Berkcan | ......................... | 324/127 |
| 6,130,599 A * | 10/2000 | Juds et al. | ................. | 338/32 H |
| 6,841,989 B2 * | 1/2005 | Goto et al. | ................ | 324/117 H |
| 7,583,073 B2 * | 9/2009 | Kumar et al. | ............. | 324/117 R |
| 8,400,139 B2 * | 3/2013 | Ausserlechner | .......... | 324/117 H |
| 8,717,016 B2 * | 5/2014 | Ausserlechner et al. | ..... | 324/251 |
| 8,729,885 B2 * | 5/2014 | Ausserlechner | .......... | 324/117 H |
| 8,760,149 B2 * | 6/2014 | Ausserlechner | .......... | 324/117 H |
| 2002/0190703 A1 * | 12/2002 | Goto et al. | ................ | 324/117 H |
| 2009/0128129 A1 * | 5/2009 | Aratani | ...................... | 324/117 H |
| 2010/0001715 A1 * | 1/2010 | Doogue et al. | ........... | 324/117 H |
| 2011/0101958 A1 * | 5/2011 | Morimoto | ................. | 324/117 H |
| 2011/0204887 A1 * | 8/2011 | Ausserlechner et al. | ..... | 324/251 |
| 2012/0112365 A1 * | 5/2012 | Ausserlechner et al. | ..... | 257/777 |
| 2012/0146165 A1 * | 6/2012 | Ausserlechner et al. | ..... | 257/421 |
| 2012/0262152 A1 * | 10/2012 | Ausserlechner | .......... | 324/117 R |

FOREIGN PATENT DOCUMENTS

| | | | |
|---|---|---|---|
| DE | 19821492 A1 * | 11/1999 | |
| DE | 199 08 652 C1 | 4/2000 | |
| DE | 100 51 160 A1 | 5/2002 | |

OTHER PUBLICATIONS

Fischer et al., DE 19821492, Machine Translation, p. 1-6, Dec. 21, 2015.*

* cited by examiner

Primary Examiner — Thomas Valone
(74) Attorney, Agent, or Firm — Schiff Hardin LLP

(57) ABSTRACT

Embodiments relate to high current sensors having generally flat conductors. In an embodiment, the conductor is formed of a non-magnetic material such as copper or aluminum and has a coarse slot, one that reduces the cross-sectional area for current flow by a factor of about two. The slot also functions as an aperture in which the sensor package can mounted, thereby protected from environmental influences.

23 Claims, 5 Drawing Sheets

HIGH CURRENT SENSORS

TECHNICAL FIELD

The invention relates generally to current sensors and more particularly to slotted high current magnetic field sensors.

BACKGROUND

Sensors that estimate the current flowing in a conductor by sensing the related magnetic field are known in the art. Such sensors can be classified generally as open-loop or closed-loop.

Closed-loop systems, in which the magnetic sensor is used as a null detector and the system generates a field which cancels the magnetic field of the current to be measured, can be more accurate than open-loop systems but suffer from a large current drain necessary to generate the compensation magnetic field.

Open-loop systems typically use linear magnetic field sensors, such as Hall plates. The specially shaped conductors used in these systems are generally difficult and more expensive to manufacture. As previously mentioned, open-loop systems are also less accurate generally.

More generally, conventional current sensors suffer from other drawbacks, including hysteresis effects, limited over-current capabilities and higher cost related to, among other things, the requirement for magnetic shielding to suppress background fields Therefore, there is a need for improved high current sensors.

SUMMARY

Embodiments relate to current sensors suitable for high currents. In one embodiment, a current sensor comprises a current rail comprising a slot formed therein and configured to create a constricted current flow area in the current rail, the slot having a length and a width, the length being greater than the width and the width being parallel to a current flow direction in the current rail; and a sensor package comprising at least one sensor element arranged on a substrate, the sensor package arranged within the slot.

In an embodiment, a current sensor comprises a current rail comprising a slot formed therein and configured to create a constricted current flow area in the current rail, the slot having a length and a width, the length being greater than the width and the width being parallel to a current flow direction in the current rail, the current rail having a length, a width and a depth, the length and the width each being greater than the depth; a board coupled to the current rail such that the depth of the current rail extends upwardly from the board; and a sensor package comprising at least one sensor element arranged on a substrate, the sensor package arranged within the slot.

In an embodiment, a method comprises coupling a sensor package to a current rail by arranging the sensor package within a slot formed in the current rail, the slot having a length and a width, the length being greater than the width; causing current to flow in the current rail in a direction orthogonal to the length of the slot; and sensing a magnetic field related to the current flowing in the current rail by at least one sensor element in the sensor package.

BRIEF DESCRIPTION OF THE DRAWINGS

The invention may be more completely understood in consideration of the following detailed description of various embodiments of the invention in connection with the accompanying drawings, in which.

Figure 1:
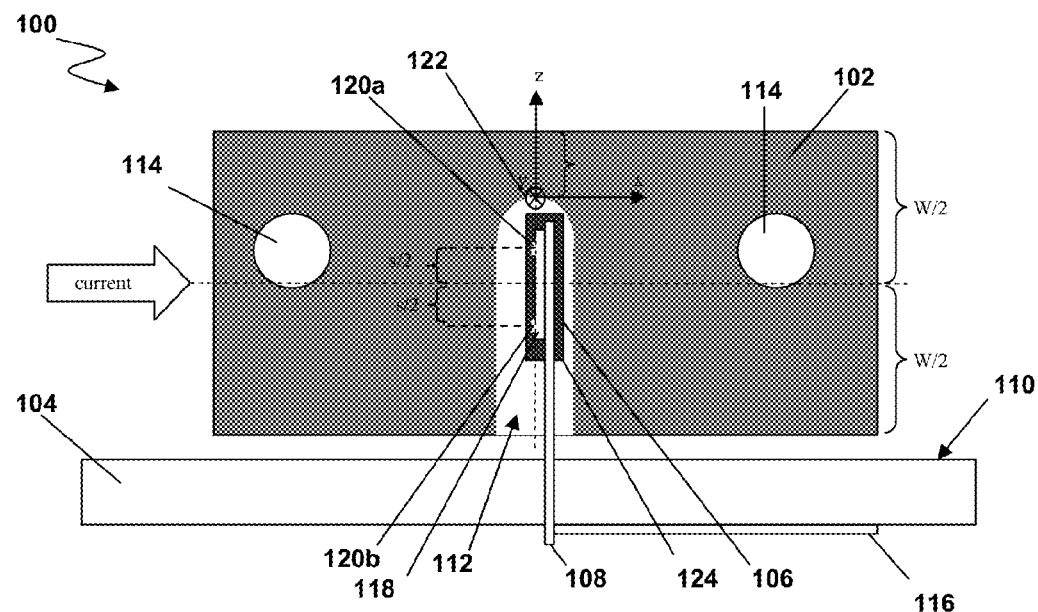
FIG. 1 is a side view of a current sensor device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to high current sensors having generally flat conductors. In an embodiment, the conductor comprises a non-magnetic material such as copper or aluminum and is formed with a coarse slot, one that reduces the cross-sectional area for current flow by a factor of about two. The slot also functions as an aperture in which the sensor package can be mounted, thereby protected from environmental influences.

Referring to FIG. 1, an embodiment of a current sensor device 100 is depicted. Device 100 comprises a current rail 102, a board 104, a sensor package 106 and at least one sensor lead 108. In the embodiment of FIG. 1, current rail 102 is mounted in a "standing" manner with respect to board 104, such that a major surface of current rail 102 is orthogonal to a mounting surface 110 of board 104. While a space is depicted between current rail 102 and board 104 in FIG. 1, in embodiments current rail 102 and board 104 are rigidly coupled to one another, such as by glue, solder or some other suitable material or methodology. In other embodiments, a less rigid connection can be used. Some embodiments can also comprise an interlayer between current rail 102 and board 104, for example a rubber layer.

Current rail 102 comprises a non-magnetic material (e.g., $\mu r$=about 0.9 to about 1.1) such as copper or aluminum and includes a slot 112 in an embodiment. Slot 112 is relatively coarse in embodiments, sized such that it reduces the cross-sectional area for current flow in current rail 102 by a factor of about two. The length of current rail 102 in the x-direction is typically longer than the width, W, in the z-direction (with respect to the orientation in FIG. 1, which can vary). The thickness of current rail 102 in the y-direction is generally the smallest dimension in embodiments, such as about 1 mm to about 5 mm in embodiments. Current rail can comprise one or more mounting holes 114, an embodiment of which is depicted in FIG. 1.

Board 104 can comprise a printed circuit board (PCB), a direct copper bonded (DCB) ceramic substrate, an insulated metal substrate (IMS) or some other suitable form in embodiments. A conductor trace 116 can be coupled to or formed on a surface of board 104 in cooperation with the at least one sensor lead 108.

Sensor package 106 comprises a substrate 118 on which at least one sensor element 120 is mounted. In embodiment, sensor package 106 comprises two sensor elements 120a and 120b, which can comprise vertical Hall elements, magnetoresistive elements such as anisotropic (AMR) or giant magnetoresistive (GMR), or some other suitable magnetic field sensor element. In an embodiment, sensor package 106 is configured such that one sensor element, 120a in FIG. 1, is positioned proximate a tip 122 of slot 112 wherein increased current density occurs because of slot 112. Therefore, sensor element 120a is positioned at or near where the magnetic field is highest to maximize the magnetic sensitivity. Sensor element 120b is positioned further from tip 122, spaced apart from sensor element 120a on substrate 118 by a distance s. In an embodiment, both sensor elements are positioned at or near the center of slot 112, i.e., at x=0 and y=0. A center line at W/2 from each the top and bottom edge (as depicted in the page in FIG. 1) defines a point about which sensor elements 120 can be symmetrically placed, with sensor element 120a at a distance of s/2 above the center line and sensor element 120b at a distance of s/2 below the center line. Positioning in this manner can help to reduce crosstalk. Mounting holes 114 can but need not also be arranged relative to this center line in an embodiment.

Both sensor elements 120 are sensitive to the y-component of the magnetic field, which is perpendicular to the drawing plane as FIG. 1 is depicted. In operation, sensor device 100 can subtract the y-component of sensor element 120b from sensor element 120a to cancel homogeneous magnetic disturbances, such as related to Earth's magnetic field.

Figure 2:
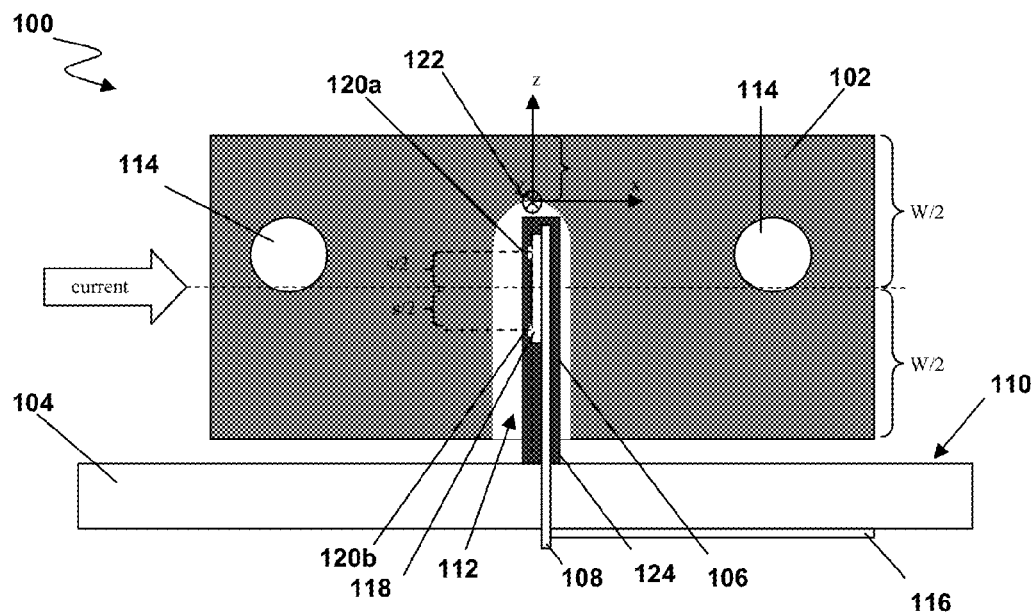
FIG. 2 is a side view of a current sensor device according to an embodiment.

In the embodiment of FIG. 1, sensor package 106 is positioned wholly within slot 112. In another embodiment, and referring to FIG. 2, improved voltage isolation between current rail 102 and sensor leads 108, which generally extend through board 104, can be achieved if the mold body 124 of sensor package 106 extends to board 104. In the embodiment of FIG. 2, mounting generally takes place from the top side during fabrication.

Figure 3:
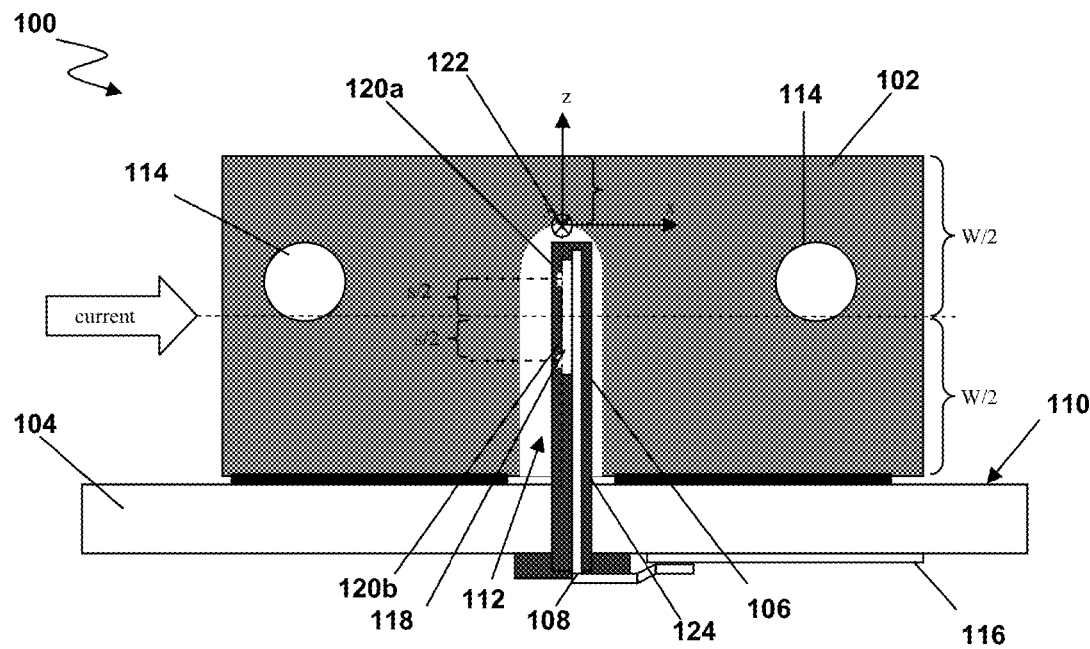
FIG. 3 is a side view of a current sensor device according to an embodiment.

Referring to FIG. 3, mounting can also take place from the bottom side, with mold body 124 extending to and through board 104. In this embodiment, it can be advantageous to avoid sharp edges or corners in the portion of mold body 124 extending through board 104 to provide a tight fit in the through-hole. It can also be advantageous in this and other embodiments for mold body 124 to be thinner than a thickness of current rail 102 so that mold body 124 does not protrude relative to current rail 102 and the entire sensor package 106 is within slot 112 for physical protection and shielding from radiated external noise, such as electromagnetic interference (EMI).

Figure 4:
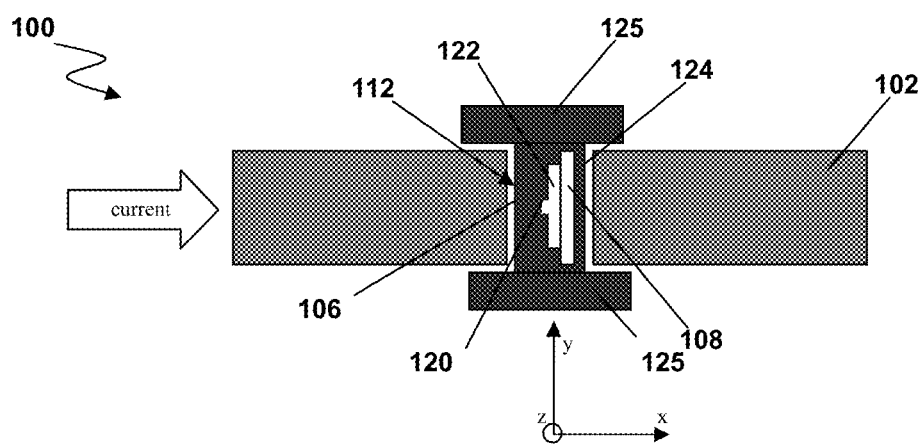
FIG. 4 is a partial top view of a current sensor device according to an embodiment.

Referring to FIG. 4, it can also be advantageous in embodiments to form mold body 124 so as to guide mold body 124 during insertion into slot 112. Thus, mold body 124 can comprise guideposts 125 in embodiments to provide clearance with respect to current rail 102. This clearance can be helpful to allow to current rail 102 to move, expand or flex slightly due to thermal effects or mechanical forces without exerting undue force on sensor package 106. The clearance or gap can also minimize thermal coupling; at large over-currents, tip 122 can become heated, and it is advantageous if this temperature increase is decoupled from sensor elements 120 and the other circuitry. It can also be advantageous if the thermal conductivity of substrate 118 and sensor leads 108, including the die paddle to which substrate 118 is bonded, is high in order to suppress temperature gradients between sensor elements 120, which can increase accuracy.

At high frequencies, the magnetic field of the current can induce eddy currents in the die paddle and sensor leads 108. These current flow predominantly in the thickness direction of leads 108 as depicted in the x-z plane. Thus, the leadframe should be thin and/or slotted in embodiments to cut the flowlines of the eddy currents. Moreover, substrate 118 should be sized thickness-wise to maximize the distance between sensor leads 108 and sensor elements 120 in embodiments.

Figure 5:
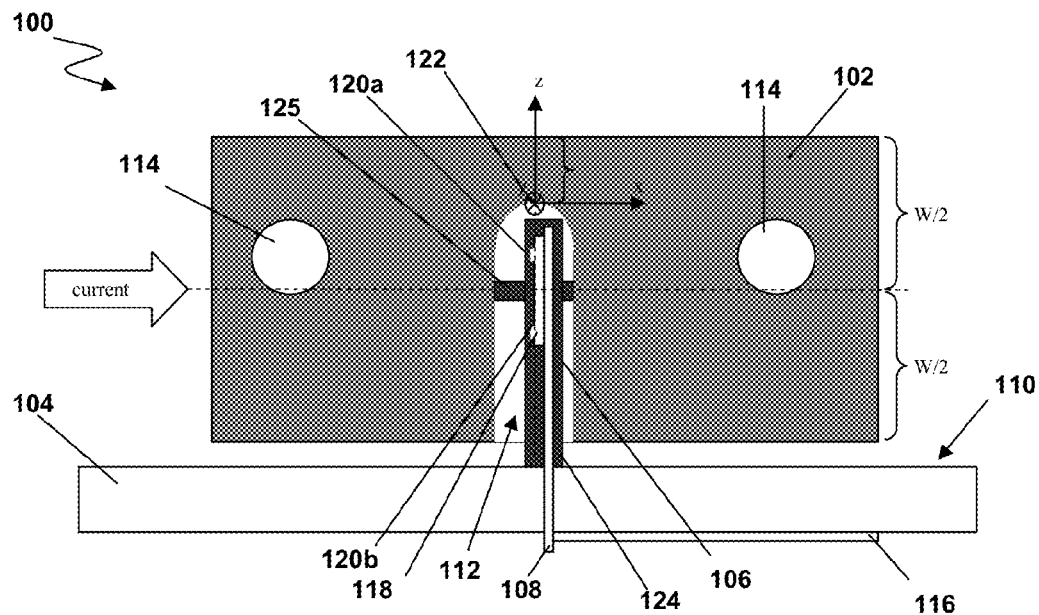
FIG. 5 is a side view of a current sensor device according to an embodiment.

Guideposts 125 can instead or additionally be arranged to assist in centering substrate 118 in slot 112, as depicted in FIG. 5.

Figure 6:
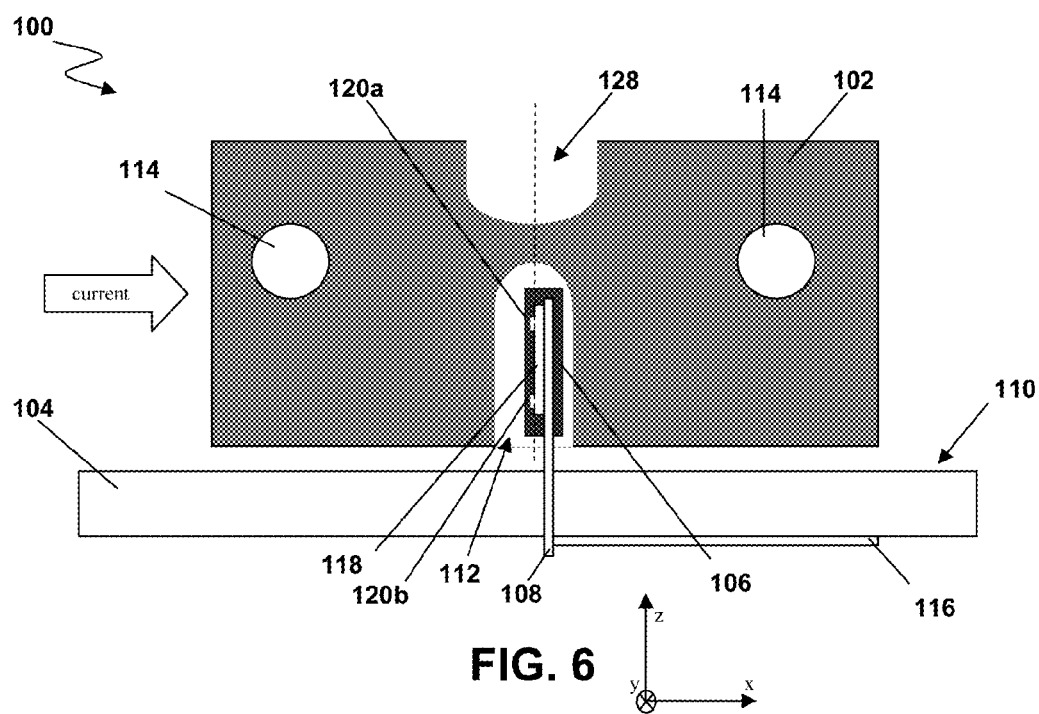
FIG. 6 is a side view of a current sensor device according to an embodiment.

Referring to FIG. 6, if the width of current rail 102 is such that slot 112 becomes too long for the length of sensor leads 108, a second slot 128 can be formed in current rail 102. In embodiments, a width in the x-direction of slot 128 is greater than that of slot 112. The embodiment of device 100 of FIG. 6 can be suitable for somewhat lower currents than other embodiments because the constricted area between slots 112 and 128 is narrower.

Figure 7A:
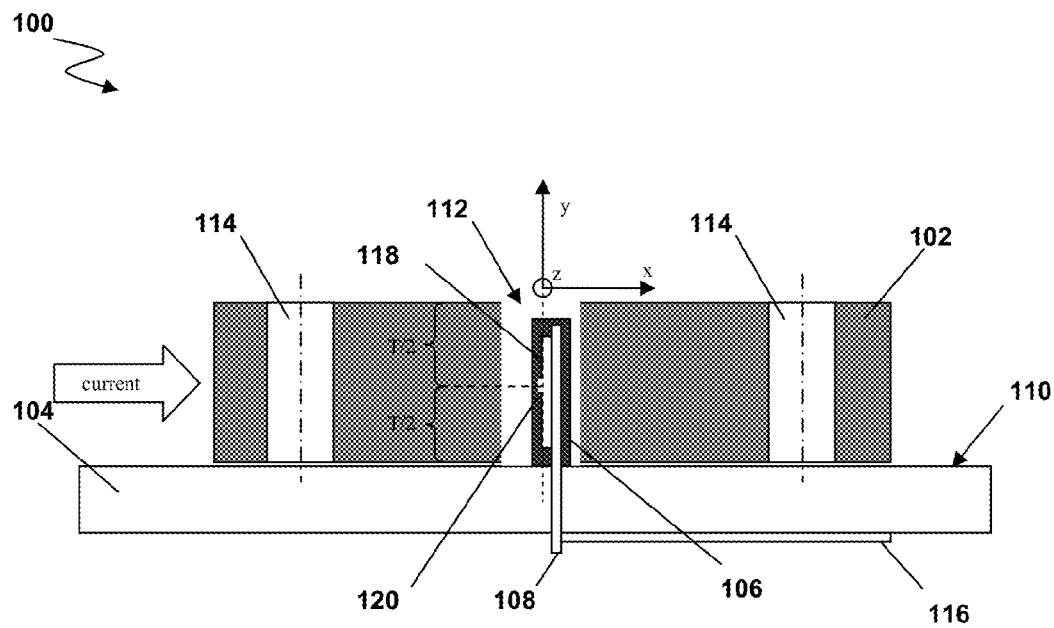
FIG. 7A is a side cross-sectional view of a current sensor device of an embodiment
Figure 7B:
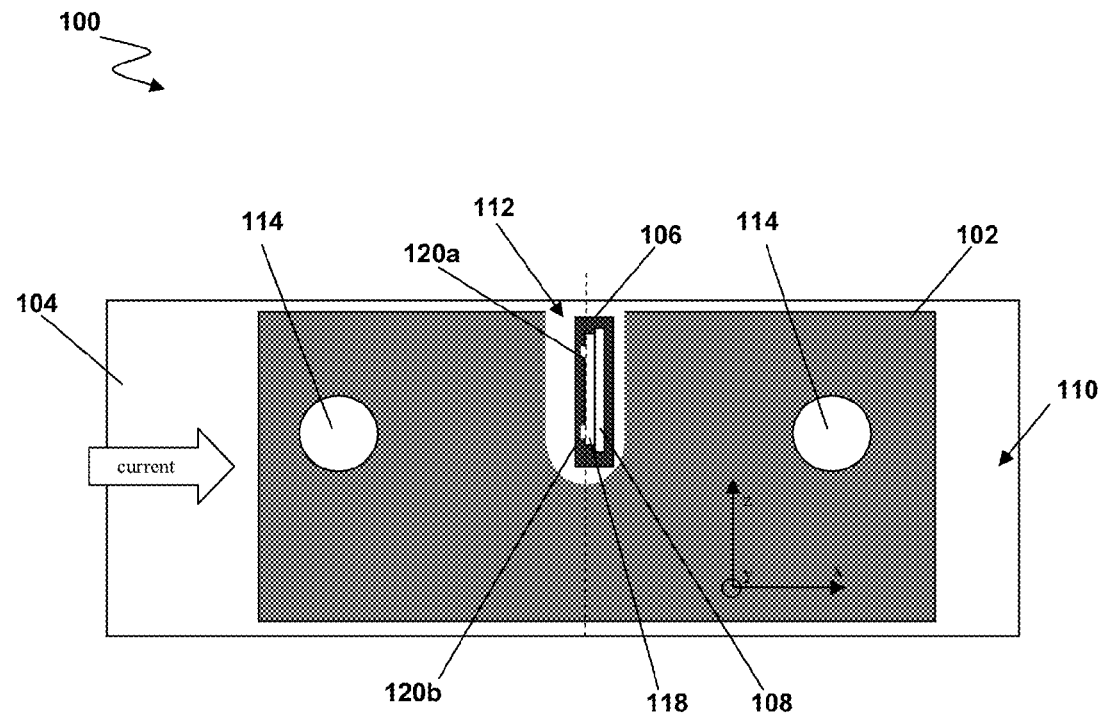
FIG. 7B is a top view of the current sensor device of FIG. 7A.

In still other embodiments, current rail 102 can be rotated in its position with respect to board 104, such that current rail 102 is "lying" instead of "standing" as in previously discussed embodiments. Referring to FIG. 7, slot 112 is still perpendicular with respect to the global direction of current flow, as in other embodiments, and sensor elements 120 are configured to detect magnetic fields in the y-direction. Sensor elements are also positioned in the center of slot 112 with respect to the current flow direction. In another embodiment, slot 112 can be arranged other than perpendicular to the global direction of current flow. For example, slot 112 can be tilted at some angle, for example about 45 degrees in one embodiment, to the current flow direction. This angle can be lesser or greater in other embodiments.

Figure 8:
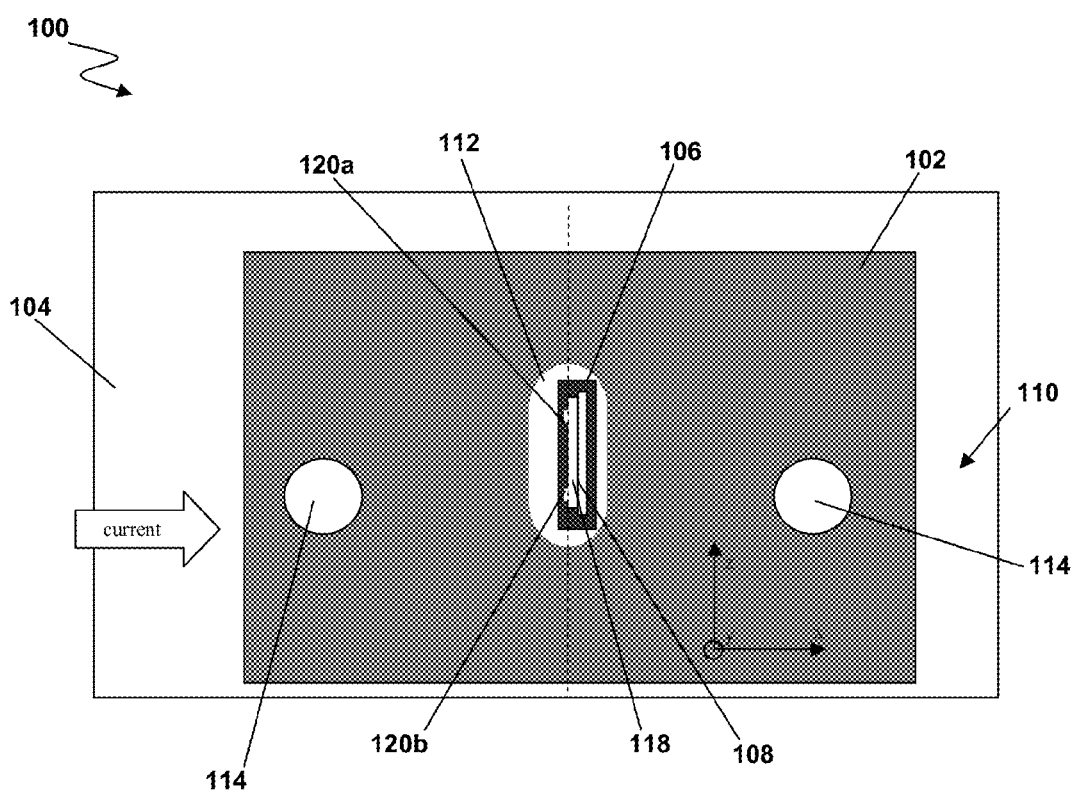
FIG. 8 is a top view of a current sensor device according to an embodiment.

The embodiment of FIG. 7 can, however, be less robust against mechanical tolerances. Therefore, referring to FIG. 8, in another embodiment slot 112 is formed as an aperture through current rail 102. The embodiment of FIG. 8 can be very robust with respect to displacement in the z-direction of sensor elements 120 relative to current rail 102. As discussed above with respect to FIG. 7, slot 112 also can be arranged other than perpendicular to the global direction of current flow.

Embodiments of the current sensor are suitable for high currents, such as about 500 A status and up to about 10 kA for pulses about 100 µs to about 10 ms long. The current rail, or conductor, has a generally low electrical resistance, such as about 15 µOhms in an embodiment. The power drain of the sensor in embodiments is also low, such as about 75 mW for the sensor circuit plus the dissipative loss in the high current path. The sensor circuit is also isolated against the current path up to about 10 kV in embodiments. As discussed, the sensor is robust with respect to background magnetic fields, and embodiments have a bandwidth of more than about 100 kHz. Embodiments of the current sensor can detect over-currents within 1 µs and is accurate up to about 0.1% to about 1% of its value and it has about 0.5 A zero point error, even after strong over-current pulses. Embodiments are not susceptible to hysteresis effects and can provide self-testing functions. These and other characteristics, abilities and functions provide improvements over and advantages with respect to conventional current sensors.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A current sensor comprising:
    a current rail comprising a slot formed therein and configured to create a constricted current flow area in the current rail, the slot having a length and a width, the length being greater than the width and the width being parallel to a current flow direction in the current rail; and
    a sensor package comprising at least two sensor elements arranged on a substrate, the sensor package arranged within the slot,
    wherein the current rail is coupled to a board in a standing manner such that a larger surface of the current rail is orthogonal to a mounting surface of the board, and an open portion of the slot is adjacent the mounting surface of the board.

2. The current sensor of claim 1, wherein the slot has a tip proximate the constricted current flow area.

3. The current sensor of claim 2, wherein one of the at least two sensor elements is positioned proximate the tip.

4. The current sensor of claim 3, wherein a second of the at least two sensor elements is spaced apart from the first sensor element in a direction opposite the tip.

5. The current sensor of claim 1, wherein the sensor package is arranged within the slot such that the at least two sensor elements are centered with respect to the width of the slot.

6. The current sensor of claim 5, wherein the at least two sensor elements are each selected from the group consisting of a vertical Hall element and a magnetoresistive sensor element.

7. The current sensor of claim 1, wherein the slot reduces a cross-sectional area for current flow in the current rail by a factor of about 2.

8. The current sensor of claim 1, further comprising at least one mounting aperture formed in the current rail.

9. The current sensor of claim 1, wherein the sensor package comprises a mold body.

10. The current sensor of claim 9, wherein the mold body extends from the slot to the board.

11. The current sensor of claim 9, wherein the sensor package comprises a mold body, and wherein the mold body extends from the slot through the board.

12. The current sensor of claim 9, wherein the mold body comprises at least one guidepost.

13. The current sensor of claim 12, wherein the at least one guidepost is disposed within the slot.

14. The current sensor of claim 1, further comprising a second slot formed in the current rail, the second slot having a second length and a second width, the second length being arranged on an axis with the length of the slot, and the second width being greater than the width of the slot.

15. The current sensor of claim 1, wherein
    the current rail has a length, a width and a depth, the length and the width of the current rail each being greater than the depth of the current rail, and
    wherein the board is coupled to the current rail such that the depth of the current rail extends upwardly from the board.

16. The current sensor of claim 15, wherein the slot has a first tip proximate the constricted current flow area.

17. The current sensor of claim 16, wherein a first one of the at least two sensor elements is positioned proximate the first tip.

18. The current sensor of claim 15, wherein the slot has a second tip proximate a second constricted flow area.

19. The current sensor of claim 18, wherein a first one of the at least two sensor elements is positioned proximate the first tip and a second one of the at least two sensor elements is positioned proximate the second tip.

20. The current sensor of claim 19, wherein the sensor package is arranged within the slot such that the at least two sensor elements are centered with respect to the width of the slot.

21. A method comprising:
    coupling a sensor package arranged within a slot formed in a current rail to the current rail, the slot having a length and a width, the length being greater than the width, wherein the current rail is coupled to a board in a standing manner such that a larger surface of the current rail is orthogonal to a mounting surface of the board, and an open portion of the slot is adjacent the mounting surface of the board;
    causing current to flow in the current rail in a direction orthogonal to the length of the slot; and
    sensing a magnetic field related to the current flowing in the current rail by at least two sensor elements in the sensor package.

22. The method of claim 21, wherein coupling a sensor package to a current rail further comprises arranging the sensor package within the slot such that the at least two sensor elements are centered with respect to the width of the slot.

23. The method of claim 21, further comprising coupling the current rail to a board.

\* \* \* \* \*